(12) United States Patent
Wehner et al.

(10) Patent No.: US 10,115,764 B2
(45) Date of Patent: Oct. 30, 2018

(54) MULTI-BAND POSITION SENSITIVE IMAGING ARRAYS

(75) Inventors: Justin G. A. Wehner, Goleta, CA (US); Edward P. Smith, Santa Barbara, CA (US)

(73) Assignee: RAYTHEON COMPANY, Waltham, MA (US)

( * ) Notice: Subject to any disclaimer, the term of this patent is extended or adjusted under 35 U.S.C. 154(b) by 845 days.

(21) Appl. No.: 13/209,953

(22) Filed: Aug. 15, 2011

(65) Prior Publication Data

US 2013/0043372 A1     Feb. 21, 2013

(51) Int. Cl.
| | |
|---|---|
| *H01L 27/00* | (2006.01) |
| *H01L 27/146* | (2006.01) |
| *H01L 31/107* | (2006.01) |
| *H01L 31/101* | (2006.01) |

(52) U.S. Cl.
CPC ...... *H01L 27/14652* (2013.01); *H01L 27/146* (2013.01); *H01L 27/14647* (2013.01); *H01L 31/101* (2013.01); *H01L 31/107* (2013.01); *H01L 31/1013* (2013.01); *H01L 31/1075* (2013.01)

(58) Field of Classification Search
CPC ............. H01L 27/146; H01L 27/14647; H01L 27/14652; H01L 31/1013; H01L 31/101; H01L 31/107; H01L 31/1075
USPC ...... 250/208.1, 338.4; 257/21, 184; 356/222
See application file for complete search history.

(56) References Cited

U.S. PATENT DOCUMENTS

| | | | |
|---|---|---|---|
| 4,468,685 A | 8/1984 | Farrow et al. | |
| 4,686,761 A | 8/1987 | Hacskaylo | |
| 4,791,467 A | 12/1988 | Amingual et al. | |
| 4,970,566 A | 11/1990 | Mendelhall | |
| 5,001,335 A | 3/1991 | Takaoka et al. | |
| 5,113,076 A | 5/1992 | Schulte | 250/370.06 |
| 5,114,866 A | 5/1992 | Ito et al. | |
| 5,149,956 A | 9/1992 | Norton | 250/211 |
| 5,279,974 A | 1/1994 | Walsh | |
| 5,300,777 A | 4/1994 | Goodwin | 250/338.4 |
| 5,367,166 A * | 11/1994 | Matthews et al. | 250/338.1 |
| 5,380,669 A | 1/1995 | Norton | 437/5 |

(Continued)

FOREIGN PATENT DOCUMENTS

| | | |
|---|---|---|
| JP | 2007/059457 | 11/2007 |
| WO | 2007135850 A1 | 11/2007 |

OTHER PUBLICATIONS

Hamamatsu Photonics, Solid State Division, PSD (Position Sensative Detector), Jul. 2003, pp. 1-16.

(Continued)

*Primary Examiner* — Georgia Y Epps
*Assistant Examiner* — Kevin Wyatt
(74) *Attorney, Agent, or Firm* — Lando & Anastasi, LLP (57) ABSTRACT

In a method embodiment, a method includes generating one or more first signals proportional to the position and intensity of photons within a first range of wavelengths and incident on a position sensing pixel of an array of position sensing pixels. The method further includes generating one or more second signals proportional to a number of photons within a second range of wavelengths and incident on an image sensing pixel of an array of image sensing pixels. The array of image sensing pixels is formed monolithically on the array of position sensing pixels.

21 Claims, 3 Drawing Sheets

(56) References Cited

U.S. PATENT DOCUMENTS

| | | | |
|---|---|---|---|
| 5,389,575 A | 2/1995 | Chin et al. | |
| 5,479,032 A * | 12/1995 | Forrest et al. | 257/190 |
| 5,479,047 A | 12/1995 | Liao et al. | |
| 5,581,084 A | 12/1996 | Chapman et al. | 250/338.4 |
| 5,621,238 A | 4/1997 | Dodd et al. | |
| 5,731,621 A | 3/1998 | Kosai | 257/440 |
| 5,751,005 A | 5/1998 | Wyles et al. | 250/370.06 |
| 5,936,268 A | 8/1999 | Cockrum et al. | |
| 5,937,274 A * | 8/1999 | Kondow | B82Y 20/00 257/186 |
| 5,959,339 A | 9/1999 | Chapman et al. | 257/440 |
| 6,147,349 A * | 11/2000 | Ray | 250/338.4 |
| 6,359,290 B1 | 3/2002 | Ehmke | |
| 6,492,239 B2 | 12/2002 | Yang et al. | |
| 6,573,488 B1 | 6/2003 | Takeshita et al. | |
| 6,657,194 B2 * | 12/2003 | Ashokan et al. | 250/338.4 |
| 6,815,790 B2 | 11/2004 | Bui et al. | |
| 6,956,214 B2 | 10/2005 | Wong et al. | 250/368 |
| 6,962,835 B2 | 11/2005 | Tong et al. | |
| 7,217,982 B2 * | 5/2007 | Taylor et al. | 257/442 |
| 7,333,181 B1 * | 2/2008 | Scott et al. | 356/3.08 |
| 7,387,944 B2 | 6/2008 | Tong et al. | |
| 7,728,297 B2 | 6/2010 | Masafumi | 250/338.3 |
| 8,153,978 B1 * | 4/2012 | Scott et al. | 250/339.02 |
| 8,421,015 B1 * | 4/2013 | Scott et al. | 250/338.4 |
| 8,441,087 B2 | 5/2013 | Smith | |
| 8,674,406 B2 * | 3/2014 | Scott | B82Y 20/00 250/338.4 |
| 2002/0109147 A1 | 8/2002 | Shirai et al. | |
| 2003/0102432 A1 | 6/2003 | Boieriu et al. | |
| 2003/0160172 A1 * | 8/2003 | Ashokan et al. | 250/338.4 |
| 2004/0135224 A1 * | 7/2004 | Bui et al. | 257/461 |
| 2004/0152224 A1 | 8/2004 | Sheppard et al. | |
| 2004/0195509 A1 * | 10/2004 | Sundaram | B82Y 20/00 250/338.1 |
| 2005/0012030 A1 | 1/2005 | Mahajan et al. | |
| 2005/0083567 A1 | 4/2005 | Chun Liu et al. | |
| 2007/0075224 A1 * | 4/2007 | Jones | H01L 27/14647 250/226 |
| 2007/0215900 A1 | 9/2007 | Maimon | |
| 2007/0235758 A1 | 10/2007 | Klipstein | |
| 2008/0230112 A1 * | 9/2008 | Barnham et al. | 136/249 |
| 2009/0173932 A1 * | 7/2009 | Ohta | G01J 5/08 257/15 |
| 2009/0242934 A1 | 10/2009 | Hu | |
| 2009/0256231 A1 | 10/2009 | Klipstein | |
| 2010/0308371 A1 * | 12/2010 | Bui et al. | 257/184 |
| 2011/0001165 A1 * | 1/2011 | Smith et al. | 257/184 |
| 2012/0280350 A1 | 11/2012 | Smith et al. | |
| 2013/0009045 A1 | 1/2013 | Smith et al. | |
| 2013/0043372 A1 | 2/2013 | Wehner et al. | |

OTHER PUBLICATIONS

Lacaita, A., et al., "Single-photon detection beyond 1 µm: performance of commercially available InGaAs/InP detectors," Applied Optics, vol. 35, No. 16, Jun. 1, 1996, pp. 2986-2996.

* cited by examiner

MULTI-BAND POSITION SENSITIVE IMAGING ARRAYS

TECHNICAL FIELD

This disclosure relates in general to photodetectors and more particularly to a system and method utilizing multi-band position sensitive imaging arrays.

BACKGROUND

Electromagnetic radiation detectors (e.g., focal plane arrays, photodetectors, and other photo-sensing circuits) are devices that are responsive to light. In general, the light that is detected may be visible light or light that is not visible to the human eye (e.g., infrared (IR) radiation). Electromagnetic radiation detectors that are responsive to light in more than one wavelength band are sometimes referred to as multi-band, multi-spectral, or multi-color detectors. One type of electromagnetic radiation detector is a position sensitive detector (PSD) that can measure a position of a light beam incident thereon in one or two-dimensions. Another type of electromagnetic radiation detector is an image sensitive detector that may be used for generating imagery (e.g., taking pictures or video imagery) and/or for non-imaging purposes (e.g., spectrometry and wave-front sensing).

Certain systems that have both position sensitive capabilities and image sensitive capabilities are limited for a variety of reasons. For example, certain systems use two separate focal planes in order to image and determine position of interest (e.g., for high frame rate windowing), thereby increasing complexity and cost. Other systems spatially separate position sensitive detectors alongside image sensitive detectors, which may limit the ability to accurately correlate position data with image data.

SUMMARY OF THE DISCLOSURE

In a method embodiment, a method includes generating one or more first signals proportional to the position and intensity of photons within a first range of wavelengths and incident on a position sensing pixel of an array of position sensing pixels. The method further includes generating one or more second signals proportional to a number of photons within a second range of wavelengths and incident on an image sensing pixel of an array of image sensing pixels. The array of image sensing pixels is formed monolithically on the array of position sensing pixels.

Technical advantages of certain embodiments include systems and methods for multi-band, position sensitive imaging arrays. Certain embodiments may provide different operational modes for a light processing system using a first array of photosensitive pixels that are co-registered with a second array of photosensitive pixels along an optical path of the light processing system. For example, certain pixels that are configured to determine the position of a particular spectrum of light beams incident thereon, according to a first operational mode, may be co-registered with certain other pixels used to generate imagery, according to a second operational mode. The co-registration of pixels that are configured to operate in different modes may facilitate, and enhance the accuracy of, correlating the data provided by those different operational modes. In certain embodiments, a light processing system may be configured to use multiple operational modes at the same time. Alternatively, bias voltages may be used to time-multiplex a variety of different operational modes one at a time. In certain embodiments, a combination of position sensitivity and image sensitivity may be optimized for particular applications and uses (e.g., for use with particular desired wavelengths for each operational mode, including visible and/or infrared wavelengths).

Other technical advantages will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present disclosure and its advantages, reference is now made to the following description, taken in conjunction with the accompanying drawings, in which.

DETAILED DESCRIPTION

Embodiments of the present disclosure and its advantages are best understood by referring to FIGS. 1A through 2C of the drawings, like numerals being used for like and corresponding parts of the various drawings.

Figure 1A:
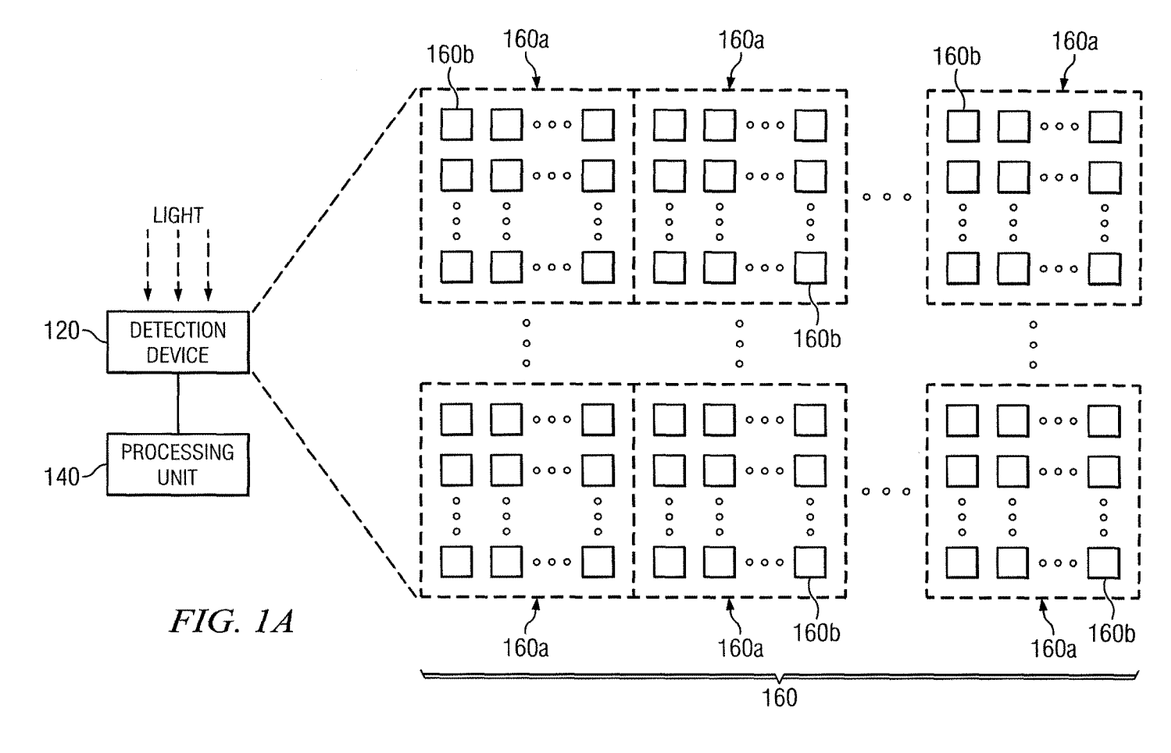
FIG. 1A is a block diagram illustrating a light-processing system including multiple arrays of light sensitive pixels collectively capable of imaging light and determining positions of interest using a single focal plane, in accordance with certain embodiments of the present disclosure.

FIG. 1A is a block diagram illustrating a light-processing system 100 capable of imaging light and determining positions of interest using a single focal plane. Light-processing system 100 may include a detection device 120 and a processing unit 140.

Detection device 120 includes a stack of multiple arrays of light-sensitive pixels 160. As explained further below, one array of pixels 160b may be monolithically formed on another array of pixels 160a. Pixels 160a and 160b may be arranged in respective two-dimensional arrays that are parallel to each other, coincident to the focal plane of detection device 120, and perpendicular to an optical path of light directed to detection device 120. Each pixel 160a of an inward array may be spatially co-registered along the same axis of an optical path of detection device 120 as one or more pixels 160b of an outward array. Thus, in certain instances, photons traveling along the optical path of detection device 120 may pass from one pixel 160a to another pixel 160b.

Pixels 160 may each accumulate charge, produce a current, and/or voltage in response to light incident thereon. The accumulated charge, the produced current and/or voltage may be used by processing unit 140 for processing of the incident light (e.g., to create an image representative of the incident light and/or to determine the position of light beams within a particular range of wavelengths). Processing unit 140 may be a combination of hardware and logic that is operable to receive signal information from detection device 120 and convert the signal information into positional data and/or an electronic image.

One or more pixels 160 of detection device 120 may be a position sensitive detector (PSD). For example, pixels 160a may each be configured to output one or more signals (e.g., current, voltage, charge, etc.) in proportion to the position and/or intensity of light beams incident thereon. In certain embodiments, pixels 160a may output one or more signals in responsive to the absorption of photons that are within a predetermined range of wavelengths corresponding to the bandgap of the material used to form pixels 160a.

One or more other pixels 160 of detection device 120 may correspond to a pixel in a captured electronic image. For example, pixels 160b may each be configured to generate one or more signals (e.g., current, voltage, charge, etc.) in proportion to the number of photons incident thereon. In certain embodiments, pixels 160b may output one or more signals in response to the absorption of photons that are within a predetermined range of wavelengths corresponding to the bandgap of the material used to form pixels 160b. In certain embodiments, the bandgap of the material used to form pixels 160a may be different from the bandgap of the material used to form pixels 160b, thereby enabling image multi-band, co-registered detection for processing system 100.

As shown in FIG. 1A, pixels 160a may have different physical dimensions than pixels 160b. For example, pixels 160a may be larger than pixels 160b, such that a greater surface area of each pixel 160a is exposed to the optical path of detector device 120 than the corresponding surface area of each pixel 160b. Conversely, pixels 160a may be smaller than pixels 160b, such that a smaller surface area of each pixel 160a is exposed to the optical path of detector 120 than the corresponding surface area of each pixel 160b. Accordingly, in certain embodiments, the number of pixels 160 per unit area may be different for pixels 160a with respect to pixels 160b.

As explained in greater detail below with reference to FIGS. 2A through 2C, which show different embodiments of substrates that may be used to form pixels 160b on pixels 160a, light processing system 100 may provide different operational modes using a first array of pixels 160a that are co-registered with a second array of pixels 160b along an optical path of detection device 120. For example, each pixel 160a may be co-registered with at least one pixel 160b such that light beams may pass from each pixel 160a to at least one other pixel 160b along the optical path of detection device 120. The co-registration of pixels 160a with 160b may facilitate, and enhance the accuracy of, correlating the data provided by different operational modes of light processing system 100 (e.g., a position detection mode and an image detection mode). For example, pixels 160a may each be configured to determine the position of a particular spectrum of light beams incident thereon, according to a first operational mode. As another example, light processing system 100 generates imagery using photons of a particular range of wavelengths absorbed by pixels 160b, according to a second operational mode. In certain embodiments, light processing system 100 may be configured to provide each of several operational modes simultaneously using pixels 160a and 160b at the same time. Alternatively, the particular operational mode used at any given time may be selected by applying particular bias voltages to pixels 160, thereby switching on and off the photodetection of some, none, or all pixels 160a and/or 160b. Light processing system 100 may be configured to time-multiplex its various operational modes by periodically switching the bias voltages applied. In certain embodiments, a combination of position sensitivity and image sensitivity may be optimized for particular applications and uses (e.g., for use with particular desired wavelengths for each operational mode, including visible and/or infrared wavelengths).

Figure 1B:
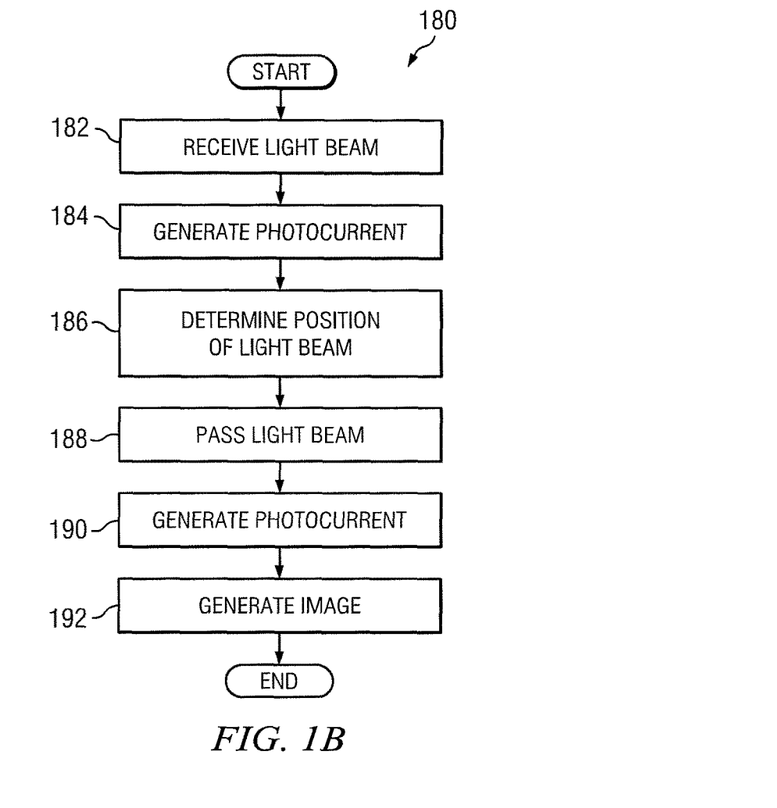
FIG. 1B is a flowchart illustrating example steps that may be performed by the light-processing system of FIG. 1A to image light beams and determine their positions, in accordance with certain embodiments of the present disclosure.

FIG. 1B is a flowchart 180 illustrating example steps that may be performed by the light-processing system 100 of FIG. 1A to image light beams and determine their positions, in accordance with certain embodiments of the present disclosure. In step 182, a light beam is received at a first pixel 160a of the first array disposed in the optical path of detection device 120.

In step 184, a first photocurrent current is generated at the first pixel 160a receiving the light beam. For example, the first photocurrent may be generated at pixel 160a by absorbing photons of the light beam. The photons may be within a first range of wavelengths corresponding to a bandgap of material used to form the first pixel 160a. The first photocurrent may be referenced to a substrate ground contact.

In step 186, a position of the light beam is determined using the first photocurrent generated at the first pixel 160a. For example, the first photocurrent may be measured by external circuitry of processing unit 140 through an electrical connection from a pixel 160a and/or 160b to a common ground applied to that pixel 160a and/or 160b. Processing unit may determine the position of the light beam based at least in part on the first photocurrent measured.

In step 188, the light beam is passed to a second pixel 160b of the second array of pixels formed on the first array of pixels. In step 190, a second photocurrent is generated at the second pixel 160b of the second array of pixels. For example, the photocurrent may be generated by absorbing photons of the light beam within a second range of wavelengths corresponding to a bandgap of material used to form the second pixel 160b. The second photocurrent may be referenced to the same substrate ground contact used to reference the first photocurrent.

In step 192, an image using at least the second photocurrent generated at the second pixel. For example, the second photocurrent may be transmitted along a conductive path to processing unit 140 for processing. Processing unit may create an image representative at least of the received second photocurrent.

In certain embodiments, one or more of the steps 182-192 of FIG. 1B may occur substantially simultaneously. For example, the photocurrents generated in steps 184 and 190 may occur substantially simultaneously. As another example, all or a portion of the determination of step 186 and the image generation of step 192 may occur substantially simultaneously.

Figure 2A:
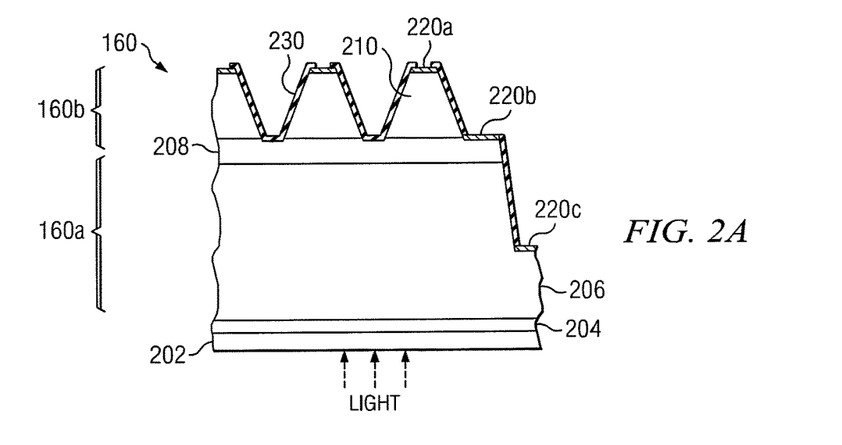
FIG. 2A is a cross-sectional view of a substrate including a layered stack of materials doped according to a n-p-n configuration, which may be used to fabricate the multiple co-registered arrays of light-sensitive pixels FIG. 1A.

FIG. 2A is a cross-sectional view of a substrate 160 including a layered stack of materials doped according to an n-p-n configuration, which may be used to fabricate the arrays of pixels 160a and 160b of FIG. 1A, in accordance certain embodiments. As shown in FIG. 2A, substrate 160 may include a base substrate 202, a buffer layer 204, a first pixel array layer 206, a barrier layer 208, a second pixel array layer 210, multiple contacts 220, and a passivation layer 230.

Base substrate 202 may include any substantially intrinsic semiconductor substrate (e.g., purely intrinsic or very lightly-doped), including without limitation silicon, mercury cadmium telluride, cadmium zinc tellurium, germanium, silicon carbide, gallium antimonide, gallium arsenide, gallium nitride (GaN), gallium phosphide, indium antimonide, indium arsenide, indium nitride, indium phosphide, or other suitable semiconductor material. The material or materials used for base substrate 202 may be selected based on desired characteristics for at least a first array of PSD pixels (e.g., pixels 160a) and a second array of imaging pixels (e.g., pixels 160b) to be fabricated from substrate 160. For example, a material may be selected based on having lattice properties similar to that of first pixel array layer 206 to be grown on base substrate 202. Base substrate 202 is transmissive to at least certain wavelengths of light, such that photons may pass to first pixel array layer 206 through base substrate 202.

Buffer layer 204 may include any suitable semiconductor substrate including, for example, the semiconductors set forth above with respect to base substrate 202. Buffer layer 204 may be used to permit lattice matching between base substrate 202 and first pixel array layer 206. In certain embodiments, buffer layer 204 may be formed by epitaxially growing buffer layer 204 on base substrate 202 using vapor-phase epitaxy, liquid-phase epitaxy, solid-phase epitaxy, molecular beam epitaxy, or other suitable form of epitaxy. In the same or alternative embodiments, buffer layer 204 may be grown to a thickness of between approximately 0.0 μm and approximately 5.0 μm.

First pixel array layer 206 may include one or more layers of any semiconductor material suitable for photon absorption, and thus light detection, of a particular wavelength or range of wavelengths. For example, first pixel layer 206 may include one or more layers of HgCdTe having an energy bandgap response to midwavelength infrared radiation (e.g., the spectral region extending from approximately 1600 nanometers to approximately 8000 nanometers); however, any suitable material having any suitable energy bandgap may be used including, for example, one or more layers of the semiconductor material set forth above with respect to base substrate 202. In certain embodiments, first pixel array layer 206 may include an n-type material having a dopant concentration between approximately $1 \times 10^{14}$ cm$^{-3}$ and approximately $1 \times 10^{17}$ cm$^{-}$. Alternatively, pixel array layer 206 may include a p-type material, as explained further below with reference to FIG. 2B.

First pixel array layer 206 may be formed, for example, by epitaxially growing first pixel array layer 206 on buffer layer 204 using vapor-phase epitaxy, liquid-phase epitaxy, solid-phase epitaxy, molecular beam epitaxy, or other suitable form of epitaxy (e.g., molecular beam epitaxy with flux of mercury, cadmium, and tellurium, with indium or arsenide as impurities). In the same or alternative embodiments, first pixel array layer 206 may be grown to a thickness of between approximately 1.0 μm and approximately 15.0 μm (e.g., to ensure position sensing layer 208 is sufficiently thick to capture light of a particular intensity). In certain embodiments, the material or materials used for first pixel array layer 206, the dopant concentration of first pixel array layer 206, the thickness of first pixel array layer 206, and/or other physical characteristics of first pixel array layer 206 may be selected based on desired characteristics for forming an array of position-sensitive pixels (e.g., pixels 160a) each configured to output one or more signals (e.g., current, voltage, charge, etc.) in proportion to the position and/or intensity of light beams incident thereon. For example, first pixel array layer 206 may absorb photons of light incident upon first pixel array layer 206 and such photons may excite electrons in first pixel array layer 206 to generate a photocurrent by means of the photovoltaic effect. The photocurrent may be referenced to a ground contact of substrate 200.

Barrier layer 208 may include one or more layers of substantially doped semiconductor material, including without limitation the semiconductor material set forth above with respect to base substrate 202. In certain embodiments, barrier layer 208 may include p-type semiconductor material having a dopant concentration between approximately $1 \times 10^{16}$ cm$^{-3}$ and approximately $1 \times 10^{19}$ cm$^{-3}$. The p-type semiconductor material may form a heterojunction with first pixel array layer 206. In certain embodiments, barrier layer 208 may be responsive to short wavelength infrared radiation (e.g., the spectral region extending from approximately 1000 nanometers to approximately 1600 nanometers) but may not absorb significant numbers of photons within that spectrum unless those photons penetrate through first pixel array layer 206.

In the same or alternative embodiments, barrier layer 208 may be grown to a thickness of between approximately 0.5 μm and approximately 2.0 μm. In certain embodiments, the material or materials used for barrier layer 208, the dopant concentration of barrier layer 208, the thickness of barrier layer 208, and/or other physical characteristics of barrier layer 208 may be selected based on desired characteristics for separating an array of PSD pixels (e.g., pixels 160a) from an array of image sensitive pixels (e.g., pixels 160b). For example, the material for barrier layer 208 may be selected based on a desired resitivity for barrier layer 208. In certain embodiments, barrier layer 208 may be formed by epitaxially growing barrier layer 208 on first pixel array layer 206 using vapor-phase epitaxy, liquid-phase epitaxy, solid-phase epitaxy, molecular beam epitaxy, or other suitable form of epitaxy (e.g., molecular beam epitaxy with flux of mercury, cadmium, and tellurium, with indium or arsenide as impurities).

Second pixel array layer 210 may include one or more layers of any semiconductor material suitable for photon absorption, and thus light detection, of a particular wavelength or range of wavelengths. For example, second pixel layer 210 may be formed from one or more layers of HgCdTe having a thickness sufficient to absorb long-wave infrared radiation (e.g., the spectral region extending from approximately 8 micrometers to approximately 12 micrometers); however, any suitable material having any suitable thickness and energy bandgap may be used including, for example, one or more layers of the semiconductor material set forth above with respect to base substrate 202. The photons absorbed in second pixel layer 210 are passed to second pixel layer 210 from underlying layers 202-208. In certain embodiments, second pixel array layer 210 may include an n-type material having a dopant concentration between approximately $1 \times 10^{14}$ cm$^{-3}$ and approximately $1 \times 10^{17}$ cm$^{-3}$. Thus, a heterojunction may be formed between barrier layer 208 and second pixel array layer 210.

Second pixel array layer 210 may be formed, for example, by epitaxially growing second pixel array layer 210 on barrier layer 208 using vapor-phase epitaxy, liquid-phase epitaxy, solid-phase epitaxy, molecular beam epitaxy, or other suitable form of epitaxy (e.g., molecular beam epitaxy with flux of mercury, cadmium, and tellurium, with indium or arsenide as impurities). In the same or alternative embodiments, second pixel array layer 210 may be grown to a thickness of between approximately 1.0 μm and approximately 15.0 μm (e.g., to ensure second pixel array layer 210 is sufficiently thick to capture light of a particular intensity). In certain embodiments, the material or materials used for second pixel array layer 210, the dopant concentration of second pixel array layer 210, the thickness of second pixel array layer 210, and/or other physical characteristics of base second pixel array layer 210 may be selected based on desired characteristics for forming an array of image-sensing pixels (e.g., pixels 160b) each configured to generate one or more signals (e.g., current, voltage, charge, etc.) in proportion to the number of photons incident thereon. For example, second pixel array layer 210 may absorb photons of light incident upon second pixel array layer 210 and such photons may excite electrons in second pixel array layer 210 to generate a photocurrent by means of the photovoltaic effect. The photocurrent may be referenced to a ground contact of substrate 200.

To fabricate a first array of light-sensitive pixels 160a from first pixel array layer 206 and a second array of light-sensitive pixels 160b from second pixel array layer 210, portions of first pixel array layer 206, barrier layer 208, and/or second pixel array layer 210 may be selectively removed from substrate 160. For example, portions may be selectively removed using any suitable combination of photolithography and etching techniques (e.g., wet chemical etching or dry plasma etching). Portions of first pixel array layer 206, barrier layer 208, and/or second pixel array layer 210 may be selectively removed to delineate and/or electrically isolate adjacent pixels 160 from each other. In addition, certain portions of barrier layer 208 may be selectively removed, for example, to optimize the resistivity of barrier layer 208.

After the selective removal of portions of first pixel array layer 206, barrier layer 208, and/or second pixel array layer 206, one or more additional layers of material may be formed on top of the exposed portions of substrate 160. For example, one or more layers of highly conductive material (e.g., aluminum, silver, copper, molybdenum, gold, or other suitable metal) may be used to form contacts 220a, 220b, and 220c outwardly from the exposed portions of first pixel array layer 206, barrier layer 208, and/or second pixel array layer 210, respectively. Contacts 220 may electrically couple portions of substrate 160 to external electronic circuitry (e.g., electronic circuitry of processing unit 140).

Contacts 220 may be formed using implantation, deposition, epitaxy, or any other suitable fabrication technique. If epitaxy is used, for example, contacts 220 may be epitaxially grown using vapor-phase epitaxy, liquid-phase epitaxy, solid-phase epitaxy, molecular beam epitaxy, or other suitable form of epitaxy. If deposition is used, for example, contacts 220 may be formed by depositing aluminum upon exposed portions of substrate 160. The material or materials used for contacts 220, the thickness of contacts 220, and/or other physical characteristics of contacts 220 may be selected based on desired characteristics to enable the provision of bias voltages to each pixel 160 fabricated from substrate 160. For example, the material or materials used for contacts 220 may be selected based on their desired ohmic and/or conductive properties.

In certain embodiments, a passivation layer 230 may be formed outwardly from the exposed portions of substrate 160. For example, a passivation layer 230 including cadmium telluride, silicon dioxide, or any other suitable material may be deposited on substrate 160 via thermal evaporation or molecular beam epitaxy. After deposition of the passivation layer 230, portions of the passivation layer 230 may be removed (e.g., via wet chemical etching or dry plasma etching in order to expose the remaining portions of the metallic layer). Passivation layer 230 may, in certain instances, serve to prevent materials of substrate 160 from having undesirable reactions with each other.

If detection device 120 of light processing system 100 has a stack of layers doped according to an n-p-n configuration, as shown in FIG. 2A, then light processing system 100 may be able to use bias voltages to select which operational mode to use from among a variety of different operational modes provided collectively by pixels 160a and 160b. If a positive bias voltage is selectively applied, the n-p junction of first pixel array layer 206 and barrier layer 208 may be in far forward bias and function as a low resistance conductor, thereby effectively switching off the photodetection of pixels 160a. Conversely, if a negative bias voltage is applied to detection device 120, the p-n junction of barrier layer 208 and second pixel array layer 210 may be in far forward bias and function as a low resistance conductor, thereby effectively switching off the photodetection of pixels 160b. Contacts 220a, 220b, and/or 220c may be used to apply the positive and/or negative bias voltages. In addition, contacts 220a, 220b, and/or 220c may be used to conduct photocurrent (or any other suitable signal). For example, each pixel 160a and 160b of FIG. 2A may be capable of conducting a photocurrent through an electrical connection to a ground common of pixels 160. The various photocurrents generated by pixels 160a and/or 160b may be measured by external circuitry of processing unit 140 for signal processing.

Figure 2B:
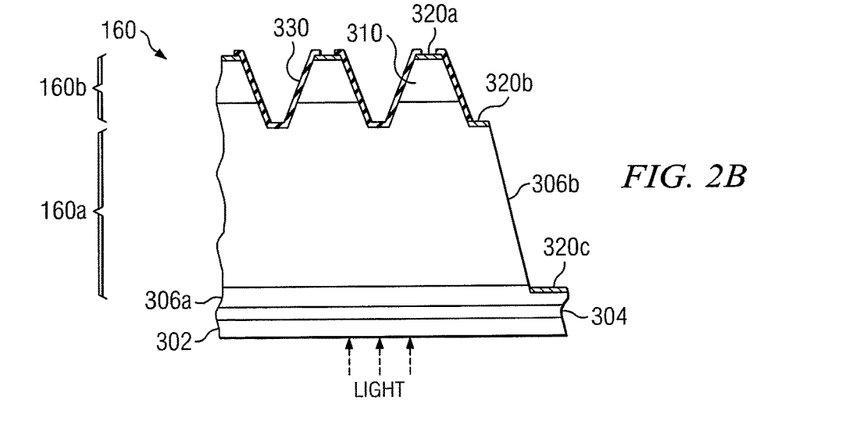
FIG. 2B is a cross-sectional view of a substrate including a layered stack of materials doped according to a p-n-p configuration, which may be used to fabricate multiple co-registered arrays of the light-sensitive pixels of FIG. 1A.

FIG. 2B is a cross-sectional view of a substrate 160 including a layered stack of materials doped according to a p-n-p configuration, which may be used to fabricate the arrays of pixels 160a and 160b of FIG. 1A, in accordance certain embodiments. As shown in FIG. 2B, substrate 160 may include base substrate 302, buffer layer 304, a first pixel array layer 306, a second pixel array layer 310, multiple contacts 320, and passivation layer 330.

With the exception of the dopant type that may be used for certain layers, base substrate 302, buffer layer 304, first pixel array layer 306, second pixel array layer 310, contacts 320, and passivation layer 330, may be formed from the same or substantially similar material, using the same or substantially similar processes, as may be used to form base substrate 202, buffer layer 204, first pixel array layer 206, second pixel array layer 210, contacts 220, and passivation layer 230, respectively, of FIG. 2A. Substrate 160 may differ from that of substrate 160, however, in that the layers 306a, 306b, and 310 used to form pixels 160 are doped according to a p-n-p configuration, respectively. That is, first pixel array layer 306 includes a thinner p-type layer 306a underlying a thicker n-type layer 306b. First pixel array layers 306a may be used to not only form pixels 160a, but also to form a substantial portion of pixels 160b, as shown in FIG. 2B. The remainder of pixels 160b may be formed from second pixel array layer 310 having a p-type dopant.

Certain embodiments having a stack of layers doped according to a p-n-p configuration, as shown in FIG. 2B, may be able to use bias voltages to select which operational mode to use from among a variety of different operational modes provided collectively by pixels 160a and 160b; however, certain alternative embodiments having an n-p-n configuration may have the same or substantially similar functionality. As shown in FIG. 2B, first pixel array layers 306a and/or 306b and second pixel array layer 310 may be coupled to a switchable voltage source capable of providing both a positive bias voltage and a negative bias voltage. If a negative bias voltage is applied, the p-n junction of first pixel array layers 306a and 306b may be in far forward bias and function as a low resistance conductor, thereby effectively switching off the photodetection of pixels 160a. Conversely, if a positive bias voltage is selectively applied, the n-p junction of first pixel array layer 306a and second pixel array layer 310 may be in far forward bias and function as a low resistance conductor, thereby effectively switching off the photodetection of pixels 160b. Contacts 320a, 320b, and/or 320c may be used to apply the positive and/or negative bias voltages. In addition, contacts 320a, 320b, and/or 320c may be used to conduct photocurrent (or any other suitable signal). For example, each pixel 160a and 160b of FIG. 2B may be capable of conducting a photocurrent through an electrical connection to a ground common of pixels 160. The various photocurrents generated by pixels 160a and/or 160b may be measured by external circuitry of processing unit 140 for signal processing.

Figure 2C:
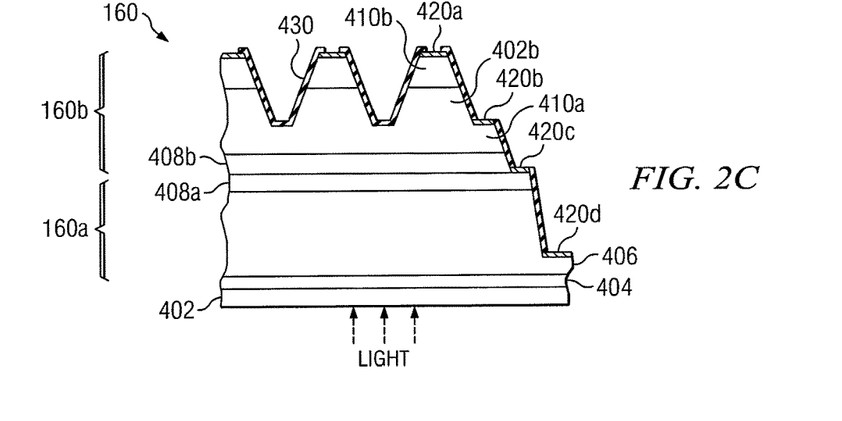
FIG. 2C is a cross-sectional view of a substrate that may be used to fabricate multiple co-registered arrays of the light-sensitive pixels of FIG. 1A, such that those pixels may be operated at the same time according to different operational modes.

Although certain example embodiments are described herein with reference to an image processing system 100 that may use bias voltages to time-multiplex a variety of different operational modes one at a time, in certain alternative embodiments image processing system 100 may be configured to use multiple operational modes simultaneously, as described further with reference to FIG. 2C.

FIG. 2C is a cross-sectional view of a substrate 160 that may be used to fabricate the arrays of pixels 160a and 160b of FIG. 1A, such that those pixels 160a and 160b may be operated at the same time according to respective operational modes (e.g., a first operational mode for position sensitivity and a second operational mode for imaging sensitivity). As shown in FIG. 2C, substrate 160 may include a base substrate 402, a buffer layer 404, a first pixel array layer 406, a barrier layer 408, a second pixel array layer 410, multiple contacts 420, and a passivation layer 430.

Base substrate 402, buffer layer 404, first pixel array layer 406, barrier layer 408a, barrier layer 408b, second pixel array layer 410a, second pixel array layer 410b, contacts 320, and passivation layer 330, may be formed from the same or substantially similar material, using the same or substantially similar processes, as may be used to form base substrate 202, buffer layer 204, first pixel array layer 206, barrier layer 208, first pixel array layer 306a, first array layer 306b, second pixel array layer 310, contacts 220, and passivation layer 230, respectively, of FIGS. 2A and 2B. That is, substrate 160 may generally include the various layers of substrate 160 stacked on top of the various layers of substrate 160 up to and including layer 208.

To fabricate a first array of light-sensitive pixels 160a from first pixel array layer 406 and barrier layer 408a, and a second array of light-sensitive pixels from barrier layer 408b and second pixel array layers 410a and 410b, portions of substrate 160 may be selectively removed from substrate 160. For example, portions may be selectively removed using any suitable combination of photolithography and etching techniques (e.g., wet chemical etching or dry plasma etching). Portions of substrate 160 may be selectively removed to delineate and/or electrically isolate adjacent pixels 160 from each other.

After the selective removal of portions of substrate 160 one or more additional layers of material may be formed on top of the exposed portions of substrate 160. For example, one or more layers of highly conductive material (e.g., aluminum, silver, copper, molybdenum, gold, or other suitable metal) may be used to form contacts 420a, 420b, 420c, and 420d outwardly from certain exposed portions substrate 160.

In addition, contacts 220a, 220b, and/or 220c may be used to conduct photocurrent (or any other suitable signal). For example, each pixel 160a and 160b may be capable of conducting a photocurrent through an electrical connection to a ground common of pixels 160. The various photocurrents generated by pixels 160a and/or 160b may be measured by external circuitry of processing unit 140 for signal processing. Contacts 420a, 420b, 420c, and/or 420d may be used to apply the positive and/or negative bias voltages in a manner that turns on or off the photodetection of pixels 160, as described further below. In addition, contacts 420a, 420b, 420c, and/or 420d may be used to conduct photocurrent (or any other suitable signal). For example, each pixel 160a and 160b of FIG. 2C may be capable of conducting a photocurrent through an electrical connection to a ground common of pixels 160. The various photocurrents generated by pixels 160a and/or 160b may be measured by external circuitry of processing unit 140 for signal processing.

Light processing system 100 may be able to use contacts to provide bias voltages to pixels 160a and 160b that selectively turn on and off the photodetection of those pixels. In certain instances, all or a portion of pixels 160a may be operational (e.g., actively detecting the position of light beams) while all or a portion of pixels 160b are also operational (e.g., actively used to generate imagery). In other instances, however, bias voltages may be selectively applied in a manner that activates or deactivates the photodetection of certain pixels 160a and/or 160b of detection device 120. For example, bias voltages may be selectively applied to certain pixels 160a and/or 160b, thereby switching on or off the photodetection of those pixels 160a and/or 160b. Similar to the example embodiments of FIGS. 2A and 2B, bias voltages may be used to time-multiplex a first operational mode of pixels 160a with a second operational mode of pixels 160b.

Accordingly, the methods and systems described herein may provide multi-band, position sensitive, imaging arrays. Certain embodiments provide different operational modes for a light processing system 100 using a first array of photosensitive pixels 160a that are co-registered with a second array of photosensitive pixels 160b along an optical path of the light processing system 100. For example, certain pixels 160a that are configured to determine the position of a particular spectrum of light beams incident thereon, according to a first operational mode, may be co-registered with certain other pixels 160b used to generate imagery, according to a second operational mode. The co-registration of pixels 160 that are configured to operate in different modes may facilitate, and enhance the accuracy of, correlating the data provided by those different operational modes. In certain embodiments, light processing system 100 may be configured to use multiple operational modes at the same time. Alternatively, bias voltages may be used to time-multiplex a variety of different operational modes one at a time. In certain embodiments, a combination of position sensitivity and image sensitivity may be optimized for particular applications and uses (e.g., for use with particular desired wavelengths for each operational mode, including visible and/or infrared wavelengths).

Although the embodiments in the disclosure have been described in detail, numerous changes, substitutions, variations, alterations, and modifications may be ascertained by those skilled in the art. Additionally or alternatively, while the disclosure may be described predominantly in reference to infrared detectors, the embodiments disclosed herein may be utilized with many types of detectors including, but not limited to, visible, infrared, ultraviolet, x-ray, or other radiation detectors. It is intended that the present disclosure encompass all such changes, substitutions, variations, alterations and modifications as falling within the spirit and scope of the appended claims.

What is claimed is:

1. A light detection device, comprising:
a first array of pixels formed from a first layer of semiconductor material having a bandgap corresponding to a first range of wavelengths, the first array of pixels disposed along a focal plane, each pixel of the first array of pixels configured as a position sensing pixel and to output one or more first signals in proportion to a position of photons incident thereon that are within the first range of wavelengths, the one or more first signals referenced to a ground common;
a first contact disposed on at least a portion of each pixel of the first array of pixels;
at least one barrier layer disposed on a surface of the first layer of semiconductor material;
a second array of pixels monolithically formed on the first array of pixels and formed from a second layer of semiconductor material disposed on a first portion of a surface of the at least one barrier layer, the second layer of semiconductor material having a bandgap corresponding to a second range of wavelengths different from the first range of wavelengths, the second array of pixels disposed along the focal plane, each pixel of the second array of pixels configured as an image sensing pixel and to generate one or more second signals in proportion to a number of photons incident thereon that are within the second range of wavelengths, the one or more second signals referenced to the ground common, wherein the pixels of the second array are sized to be smaller than the pixels of the first array;
a second contact disposed on at least a portion of each pixel of the second array of pixels; and
a third contact disposed on a second portion of the surface of the at least one barrier layer,
wherein the second array of pixels are formed on and disposed outwardly from the first array of pixels such that a plurality of pixels of the second array are associated with and spatially co-registered along the same axis of an optical path of incident photons with each pixel of the first array of pixels, the first and second arrays of pixels arranged along respective planes that are parallel to each other and to the focal plane and that are perpendicular to the optical path, such that the incident photons travel along the optical path from the first array of pixels to the second array of pixels.

2. The device of claim 1, wherein:
the first array of pixels has a first resolution of pixels per square micron; and
the second array of pixels has a second resolution of pixels per square micron, the first resolution being different from the second resolution.

3. The device of claim 1, wherein the one or more first signals outputted by each pixel of the first array of pixels is proportional to electron flow conducted from the pixel to the ground common through at least one respective contact, including the first and the third contacts.

4. The device of claim 1, wherein the one or more second signals outputted by each pixel of the second array of pixels is proportional to the amount of electron flow conducted from the pixel to the ground common through at least one respective contact, including the second and the third contacts.

5. The device of claim 1, wherein a first pixel of the first array of pixels comprises a plurality of mesa sidewalls and is disposed inwardly from a second pixel of the second array of pixels along the optical path of the first and second arrays of pixels, the second pixel comprising a plurality of mesa sidewalls configured such that each mesa sidewall of the plurality of mesa sidewalls of the second pixel is not continuous with the mesa sidewalls of the first pixel of the first array of pixels.

6. The device of claim 1, wherein a number of pixels per unit area is smaller for the first array of pixels than the second array of pixels.

7. The device of claim 1, further comprising:
a base substrate formed of an intrinsic semiconductor material; and
a buffer layer disposed on the base substrate and positioned between the base substrate and the first layer of semiconductor material.

8. The device of claim 7, wherein the buffer layer is configured to provide lattice matching between the base substrate and the first layer of semiconductor material.

9. The device of claim 1, wherein the first layer of semiconductor material includes HgCdTe and the first range of wavelengths includes a spectral region extending from 1600 nanometers to 8000 nanometers.

10. The device of claim 1, wherein the first layer of semiconductor material includes a first n-type semiconductor material having a dopant concentration between $1 \times 10^{14}$ cm$^{-3}$ and $1 \times 10^{17}$ cm$^{-3}$, the at least one barrier layer includes a p-type semiconductor material having a dopant concentration between $1 \times 10^{16}$ cm$^{-3}$ and $1 \times 10^{19}$ cm$^{-3}$, the at least one barrier layer being configured to form a first heterojunction with the first layer of semiconductor material, and the second layer of semiconductor material includes a second n-type semiconductor material having a dopant concentration between $1 \times 10^{14}$ cm$^{-3}$ and $1 \times 10^{17}$ cm$^{-3}$, the at least one barrier layer being configured to form a second heterojunction with the second layer of semiconductor material.

11. The device of claim 1, wherein a thickness of the first layer of semiconductor material is between 1 micrometer and 15 micrometers.

12. The device of claim 1, wherein the barrier layer has a thickness between 0.5 micrometers and 2 micrometers.

13. The device of claim 1, wherein the second layer of semiconductor material includes HgCdTe and the second range of wavelengths includes a spectral region extending from 8 micrometers to 12 micrometers.

14. The device of claim 1, wherein the second layer of semiconductor material has a thickness between 1 micrometer and 15 micrometers.

15. A method of operating a light detection device, comprising:
receiving a light beam at a first pixel of a first array of pixels;
generating a first photocurrent at the first pixel of the first array of pixels by absorbing photons of the light beam within a first range of wavelengths corresponding to a bandgap of material used to form the first pixel, the first photocurrent referenced to a ground common through a first contact disposed on at least a portion of the first pixel;
transmitting the first photocurrent to a second contact disposed on a first portion of a surface of at least one barrier layer formed directly on the material used to form the first pixel;
determining a position of the light beam using the first photocurrent;

passing the light beam through the at least one barrier layer to a second pixel of a second array of pixels monolithically formed on the first array of pixels and disposed on a second portion of the surface of the at least one barrier layer, wherein the pixels of the second array are sized to be smaller than the pixels of the first array such that a plurality of pixels of the second array are associated with and spatially co-registered along the same axis of an optical path of the photons of the light beam with each pixel of the first array of pixels;

generating a second photocurrent at the second pixel of the second array of pixels by absorbing the photons of the light beam within a second range of wavelengths corresponding to a bandgap of material used to form the second pixel, the second photocurrent referenced to the ground common through a third contact disposed on at least a portion of the second pixel;

transmitting the second photocurrent to the second contact; and generating an image using at least the second photocurrent.

16. The method of claim 15, further comprising using a tangible processing unit to spatially correlate the first photocurrent with the second photocurrent.

17. The method of claim 15, wherein the maximum wavelength of the first range of wavelengths is less than the maximum wavelength of the second range of wavelengths.

18. The method of claim 15, wherein the first photocurrent is proportional to the position of photons of the light beam absorbed by the first pixel.

19. The method of claim 15, wherein the second photocurrent is proportional to a number of photons of the light beam absorbed by the second pixel.

20. The method of claim 15, further comprising selecting an operational mode of the light detection device by selectively biasing a first semiconductor junction between the barrier layer and the material used to form the first pixel and selectively biasing a second semiconductor junction between the barrier layer and the material used to form the second pixel.

21. The method of claim 15, further comprising selectively applying bias voltages to a first plurality of pixels of the first array of pixels and a second plurality of pixels of the second array of pixels to selectively activate and deactivate photodetection by the first and second pluralities of pixels.

* * * * *